(12) United States Patent
Chang et al.

(10) Patent No.: US 9,877,386 B2
(45) Date of Patent: Jan. 23, 2018

(54) SUBSTRATE STRUCTURE AND METHOD OF MANUFACTURING THE SAME

(71) Applicant: Siliconware Precision Industries Co., Ltd., Taichung (TW)

(72) Inventors: Cheng-An Chang, Taichung (TW); Sung-Huan Sun, Taichung (TW); Chien-Hung Wu, Taichung (TW); Yi-Cheih Chen, Taichung (TW); Wen-Kai Liao, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 11 days.

(21) Appl. No.: 14/667,795

(22) Filed: Mar. 25, 2015

(65) Prior Publication Data
US 2016/0079148 A1  Mar. 17, 2016

(30) Foreign Application Priority Data
Sep. 17, 2014 (TW) .............................. 103132038 A (51) Int. Cl.
*H05K 1/02* (2006.01)
*H05K 3/46* (2006.01)
*H01L 23/522* (2006.01)
*H01L 23/525* (2006.01)
*H01L 23/00* (2006.01)

(52) U.S. Cl.
CPC ......... *H05K 1/0298* (2013.01); *H01L 23/525* (2013.01); *H01L 23/5226* (2013.01); *H01L 24/02* (2013.01); *H05K 3/46* (2013.01); *H01L 24/03* (2013.01); *H01L 24/05* (2013.01); *H01L 24/11* (2013.01); *H01L 24/13* (2013.01); *H01L 2224/024* (2013.01); *H01L 2224/0235* (2013.01); *H01L 2224/0236* (2013.01); *H01L 2224/0239* (2013.01); *H01L 2224/02311* (2013.01); *H01L 2224/02313* (2013.01); *H01L 2224/0401* (2013.01); *H01L 2224/05008* (2013.01); *H01L 2224/05147* (2013.01); *H01L 2224/05548* (2013.01); *H01L 2224/05558* (2013.01); *H01L 2224/05569* (2013.01); *H01L 2224/05647* (2013.01);
(Continued)

(58) Field of Classification Search
CPC .............................. H05K 3/46; H05K 1/0298
USPC ....................................................... 174/262
See application file for complete search history.

(56) References Cited

U.S. PATENT DOCUMENTS

| | | | |
|---|---|---|---|
| 6,897,568 B2 * | 5/2005 | Haimerl .................. | H01L 24/10 257/779 |
| 8,178,965 B2 * | 5/2012 | Meyer ................. | H01L 23/3114 257/684 |
| 8,604,359 B2 * | 12/2013 | Chen .................... | H05K 3/4694 174/260 |

* cited by examiner

*Primary Examiner* — Jeremy C Norris
(74) *Attorney, Agent, or Firm* — Mintz Levin Cohn Ferris Glovsky and Popeo, P.C.; Peter F. Corless; Steven M. Jensen (57) ABSTRACT

A substrate structure is provided, including: a carrier having at least a wiring area defined and positioned on a portion of a surface of the carrier; a first insulating layer formed on the wiring area; a wiring layer formed on the first insulating layer formed on the wiring area; and a second insulating layer formed on the wiring area. Therefore, a contact surface between the carrier and the first and second insulating layers is reduced by reducing the areas of the first and second insulating layers, whereby a substrate warpage due to mismatch of coefficients of thermal expansion (CTE) is avoided. The present invention further provides a method of manufacturing the substrate structure as described above.

18 Claims, 6 Drawing Sheets

(52) U.S. Cl.
CPC ............... *H01L 2224/131* (2013.01); *H01L 2224/13022* (2013.01); *H01L 2224/13024* (2013.01)

SUBSTRATE STRUCTURE AND METHOD OF MANUFACTURING THE SAME

CROSS-REFERENCES TO RELATED APPLICATIONS

This application claims under 35 U.S.C. §119(a) the benefit of Taiwanese Application No. 103132038, filed Sep. 17, 2014, the entire contents of which are incorporated herein by reference.

BACKGROUND OF THE INVENTION

1. Field of the Invention

The present invention relates to substrate structures, and, more particularly, to a substrate structure with enhanced reliability and a method of manufacturing the same.

2. Description of the Prior Art

The versatility and high performance electronic products have proved indispensible along with the booming of electronic industries. So far, the techniques are applied in the chip package field including a flip-chip application, such as chip scale package (CSP), direct chip attached (DCA), multi-chip module (MCM) and so on, or integrating 3-D chip stacking to a 3-D IC chip stacking technique.

The conventional semiconductor package of 3D chip stacking provides a through silicon interposer (TSI) having a plurality of through-silicon vias which penetrate the TSI, and one side of the TSI has a redistribution layer (RDL) to facilitate the electrical connection of the RDL to electrode pads of a semiconductor chip having less pad-spacing, and the another side of the TSI is electrically connected to the solder pads of packaging substrate having larger pad-spacing.

Figure 1:
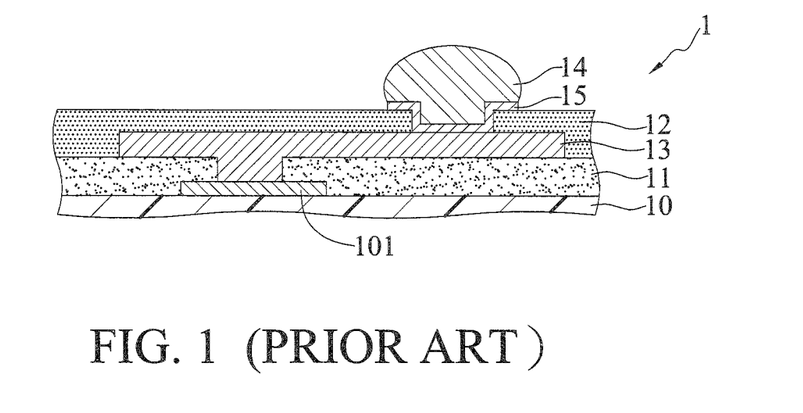
FIG. 1 is a cross-sectional view of a conventional substrate structure.

As shown in FIG. 1, a conventional substrate structure 1 of TSI has a carrier 10, a first insulating layer 11 formed on the entire surface of the carrier 10, a wiring layer 13 formed on the first insulating layer 11, a second insulating layer 12 formed on the wiring layer 13 and the first insulating layer 11, with a portion of the wiring layer 13 exposed therefrom, and a plurality of conductive elements 14 formed on the wiring layer 13.

FIGS. 1A-1E are top views of the steps of a method of manufacturing the conventional substrate 1 structure of FIG. 1.

Figure 1A:
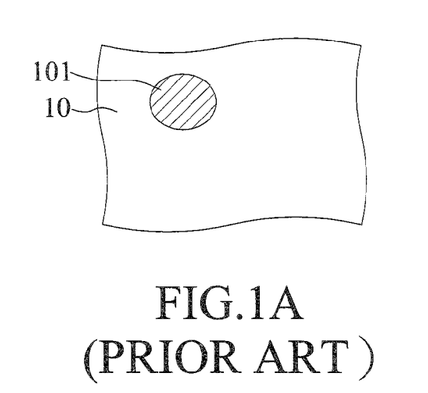
FIGS. 1A-1E are top views of a method of manufacturing a conventional substrate structure.

As shown in FIGS. 1 and 1A, a carrier 10, such as a silicon wafer, is provided, and a plurality of conductive pads 101 are formed on the carrier 10.

Figure 1B:
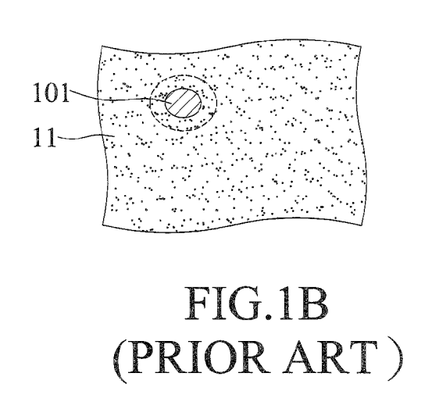

As shown in FIG. 1B, a first insulating layer 11 is formed on the entire surface of the carrier 10, and a portion of a surface of each of the conductive pads 101 is exposed from the first insulating layer 11.

Figure 1C:
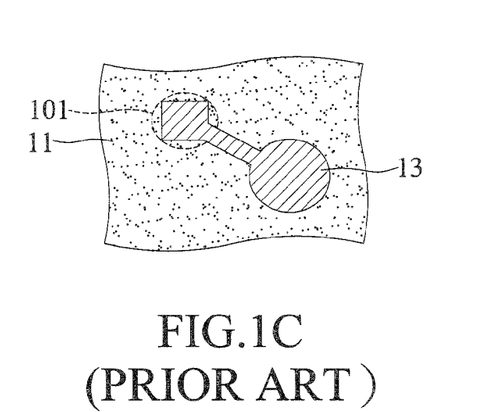

As shown in FIG. 1C, a wiring layer 13, such as RDL, is formed on the first insulating layer 11 and electrically connected to the conductive pad 101.

Figure 1D:
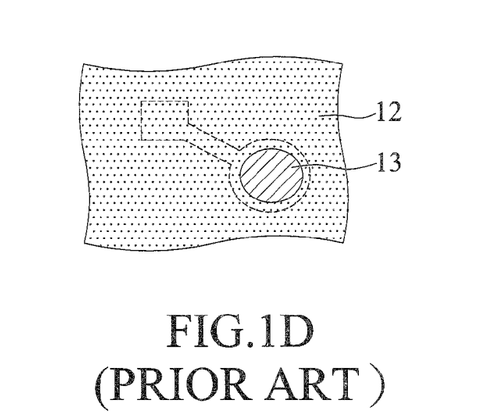

As shown in FIG. 1D, a second insulating layer 12 is formed on the wiring layer 13 and the first insulating layer 11, and a portion of a surface of the wiring layer 13 is exposed from the second insulating layer 12.

Figure 1E:
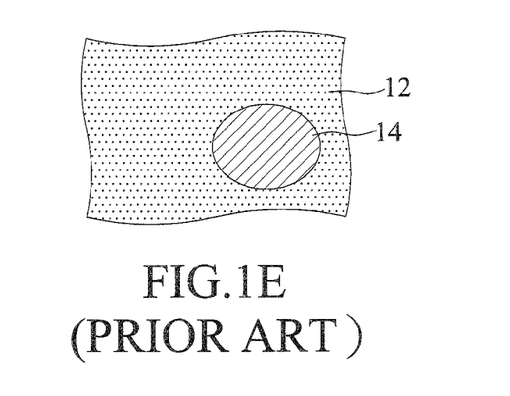

As shown in FIG. 1E, under bump metallurgy (UBM) 15 is formed on the exposed surface of the wiring layer 13, and a conductive element 14 such as a solder bump is disposed on the under bump metallurgy 15.

However, in the substrate structure 1 thus-manufactured the contact surface between the carrier 10 and the first insulating layer 11 is very large, and the difference of coefficient of thermal expansion (CTE) between the two layers is also very large. Therefore, during the thermal cycle it is difficult for the conventional substrate structure 1 to release thermal stress, and warpage of the conventional substrate structure 1 will be caused easily. Since the stress reliability of the conductive element 14 is poor, it is difficult to carry or apply subsequent processes to the conventional substrate structure 1.

Therefore, how to overcome the weakness of the conventional techniques is an important issue.

SUMMARY OF THE INVENTION

To overcome the drawbacks of the conventional techniques, the present invention provides a substrate structure, comprising: a carrier which is defined with at least one wiring area, wherein the wiring area is positioned on a portion of the surface of the carrier and has a junction portion; a first insulating layer formed on the wiring area of the carrier; a wiring layer formed on the first insulating layer; and a second insulating layer formed on the carrier.

The present invention further provides a method of manufacturing a substrate structure, comprising: forming a first insulating layer on at least a wiring area of a carrier, wherein the wiring area is positioned on a portion of a surface of the carrier; forming a wiring layer on the first insulating layer overlying the wiring area; and forming a second insulating layer on the carrier.

According to the substrate structure and the method of manufacture mentioned above, the carrier has a plurality of conductive pads electrical connecting to the wiring layer.

According to the substrate structure and the method of manufacture mentioned above, the carrier has a dielectric layer for the first insulating layer, wiring layer, and the second insulating layer to be formed thereon.

According to the substrate structure and the method of manufacture mentioned above, the first insulating layer is formed merely on a junction portion of the wiring area.

According to the substrate structure and the method of manufacture mentioned above, the wiring layer is formed with a ladder-shaped portion at a position corresponding to a side of the first insulating layer.

According to the substrate structure and the method of manufacture mentioned above, the second insulating layer is formed only within the wiring area.

According to the substrate structure and the method of manufacture mentioned above, the second insulating layer has a plurality of vias that expose a portion of the wiring layer, and the vias are positioned within the junction portion of the wiring area. A conductive element is further formed in the via and electrically connected to the wiring layer.

According to the substrate structure and the method of manufacture mentioned above, the second insulating layer covers the wiring layer.

Accordingly, the first and the second insulating layer of the substrate structure and the method of manufacture according to the present invention are formed only within the wiring area of the carrier. Compared with the conventional techniques, during the thermal process of the present invention, since the substrate structure can releases stress efficiently, the substrate structure is prevented from warpage and also enhances the stress reliability of the conductive element.

DETAILED DESCRIPTION OF THE PREFERRED EMBODIMENTS

The present invention is described in the following with specific embodiments, so that one skilled in the art can easily understand other advantages and effects of the present invention from the disclosure of the present invention.

It should be noted that structure, ratio, and size depicted in the drawings of the specification are generally represented for illustrative purposes and more easily understood by a person having ordinary skill in the art, but does not intend to limit the scope of the claims, and thus does not have substantive technical meaning. Any modification of structure, change of ratio relationship, and adjustment of size of the invention not affecting the effect brought out by the invention should still fall in the scope of the invention. In addition, terms such as "on", "under", "first", "second", "a", etc. are merely for illustrative purposes and should not be construed to limit the scope of the present invention, and the change and adjustment of the relative relationship should still fall within the scope of the invention while the technical content does not substantively affected.

FIGS. 2A-2E are cross-sectional views of a substrate structure 2a manufactured by a method according to the present invention, and FIGS. 3A-3E are top views of the corresponding FIGS. 2A-2E, respectively. In an embodiment, the method of manufacturing the substrate structure 2 can be performed by a wafer level process.

Figure 2A:
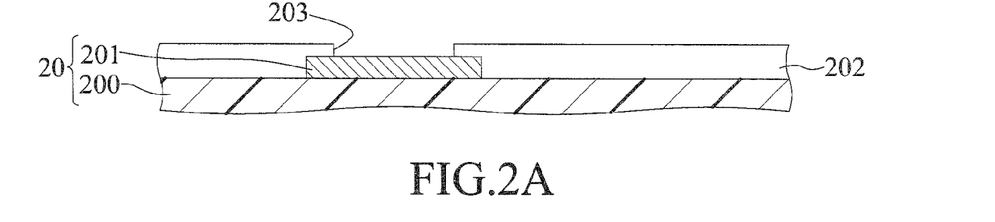
FIGS. 2A-2E are cross-sectional views of a method of manufacturing a substrate structure according to the present invention, and FIGS. 2C' and 2E' are another embodiments of FIGS. 2C and 2E.
Figure 3A:
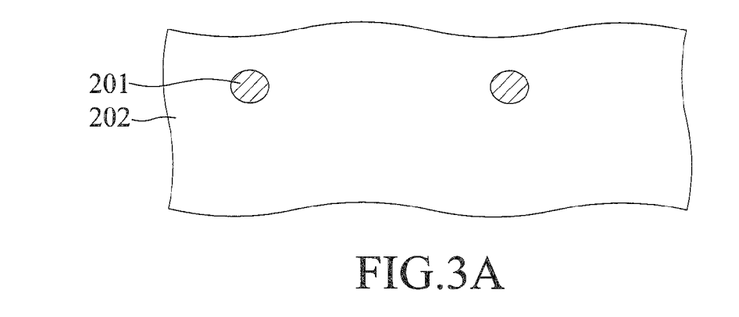
FIGS. 3A-3E are top views of the corresponding FIGS. 2A-2E, and FIG. 3C' is another embodiment of FIG. 3C.

As shown in FIGS. 2A and 3A, a carrier 20 is provided, which has a body 200, a plurality of conductive pads 201 formed on the body 200, and a dielectric layer 202 formed on the body 200 and the conductive pads 201 and having a plurality of openings 203 that expose the conductive pads 201.

In an embodiment, the body 200 is of a great variety of types, such as a semiconductor board including an interposer having through-silicon vias (TSVs), a through silicon interposer (TSI), or a semiconductor chip. In another embodiment, the body 200 has another dielectric layer (not shown) formed therein and an internal circuit (not shown) that is optionally electrically connected to the conductive pads 201. The body 200 does not have any specific limitation.

Moreover, the dielectric layer 202 is formed from $SiN_x$ or $SiO2$.

Figure 2B:
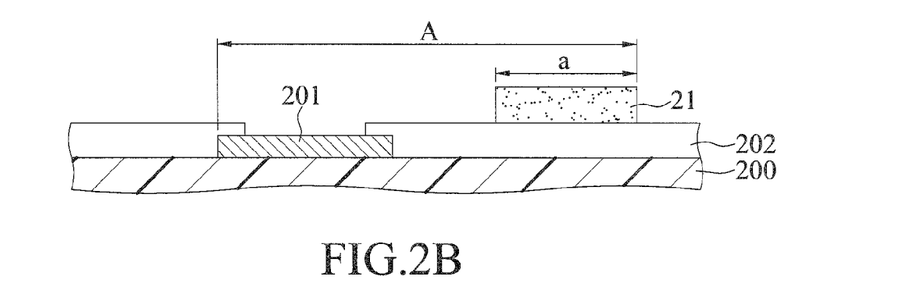
Figure 3B:
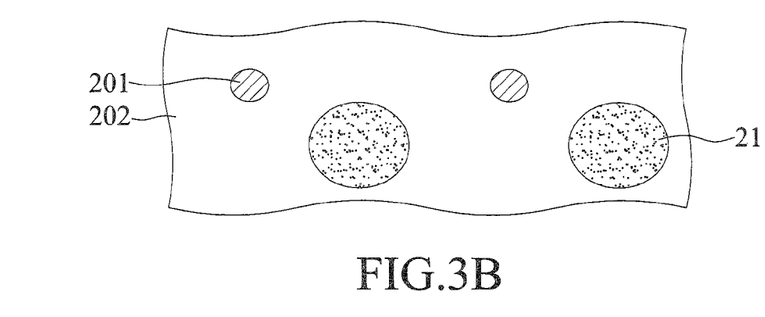

As shown in FIGS. 2B and 3B, a first insulating layer is formed on a portion of a surface of the dielectric layer 202.

In an embodiment, the surface of dielectric layer 202 is defined with a plurality of wiring areas A, and each of the wiring areas A is also defined with a junction portion a. The first insulating layer 21 is formed within the junction portion a only, and the conductive pads 201 are disposed on the body 200 at an area outside of the junction portion a.

In an embodiment, the wiring areas A refer to shaped regions occupied by a wiring layer to be mentioned thereafter, and the junction portion a refers to a defined area of the substrate structure 2 for an electronic device (such as a chip, a circuit board, and the like) to be mounted thereon.

In an embodiment, the first insulating layer 21 is a passivation layer, which is made of polymers, such as photosensitive dielectric material (PDM), polyimide (PI), bis-benzo-cyclo-butene (BCB), polybenzoxazole (PBO), epoxy, silicone, and so on. In an embodiment, the first insulating layer 21 is formed by coating a photosensitive dielectric material on the entire surface of the dielectric layer 202, and then removing the excess photosensitive dielectric material by exposure and development, allowing the remaining photosensitive dielectric material to be regarded as the first insulating layer 21.

Figure 2C:
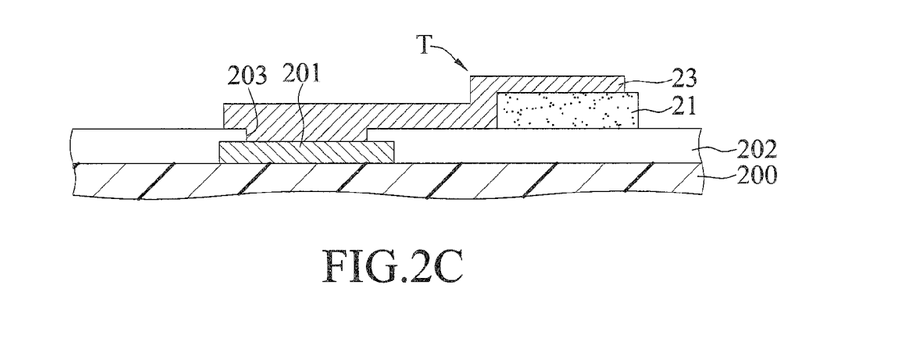
Figure 3C:
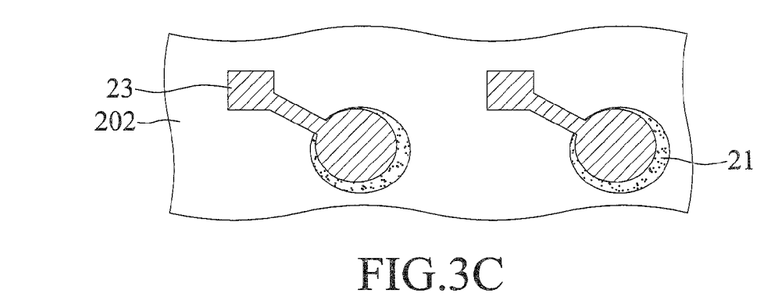

As shown in FIGS. 2C and 3C, a wiring layer 23 is formed on the dielectric layer 202 and extends to the first insulating layer 21, allowing the wiring layer 23 to be formed partially on the first insulating layer 21 and partially on the dielectric layer 202. The wiring layer 23 is further formed in the openings 203 for being electrically connected to the conductive pad 201.

In an embodiment, the wiring layer 23 is further formed with a ladder-shaped portion at a position corresponding to a side of the first insulating layer 21.

In an embodiment, the wiring layer 23 is a redistribution layer (RDL). The wiring layer 23 is formed by sputtering a seed layer on the conductive pads 201, the dielectric layer 202, and the first insulating layer 21, forming a patterned resist layer on the seed layer by a lithography process, then electroplating a metal layer, such as copper, in the opening region of the patterned resist layer, and finally removing the resist layer and a seed layer under the resist layer. The metal layer and the remaining seed layer are formed as the wiring layer 23. In an embodiment, the lithography process comprises photoresist coating, exposure of the photoresist, development of the photoresist, the resist layer etching and removing, and so on.

In another embodiment, as shown in FIGS. 2C' and 3C', the first insulating layer 21' is formed along the wiring area A', such that the wiring layer 23 contacts with and is formed on the first insulating layer 21' only, without being in contact with the dielectric layer 202. More specifically, the wiring areas A and A' can be varied in size depending on the occupation area of the wiring layer 23, thereby the sizes of wiring areas A and A' are different in different embodiments.

Figure 2D:
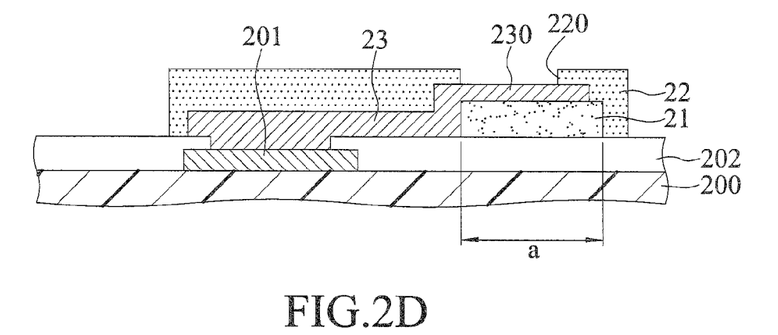
Figure 3D:
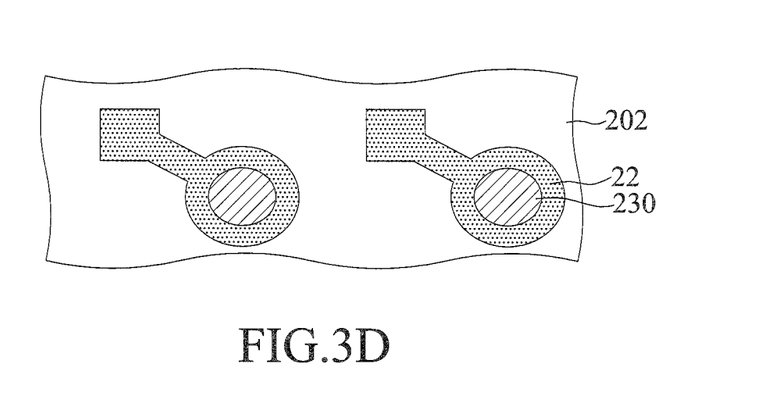

As shown in FIGS. 2D and 3D, a second insulating layer 22 is formed on the wiring area A and covering the wiring layer 23 and the first insulating layer 21.

In an embodiment, the second insulating layer 22 has a plurality of vias 220 that expose the wiring layer 23, and the wiring layer 23 in the vias 220 is serves as the conductive pads 230.

In an embodiment, the vias 220 are positioned within the junction portion a.

In an embodiment, the second insulating layer 22 is a passivation layer, which is made of polymers, such as photosensitive dielectric material (PDM), polyimide (PI), bis-benzo-cyclo-butene (BCB), polybenzoxazole (PBO), epoxy, silicone and so on. For example, during the formation of the second insulating layer 22 a photosensitive dielectric material is coated onto and covers the entire exposed surface of the dielectric layer 202, the entire exposed surface of the wiring layer 23, and the entire exposed surface of the first insulating layer 21. The excess photosensitive dielectric material is removed by exposure and development so as for the remaining photosensitive dielectric material to be formed as the first insulating layer 22.

In an embodiment, the second insulating layer 22 and the first insulating layer 21 can be made of the same or different materials.

Figure 2E:
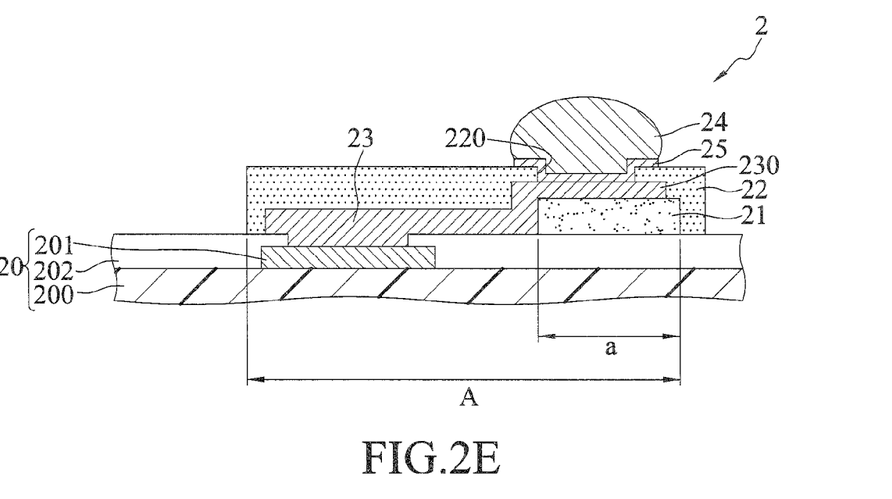
Figure 3E:
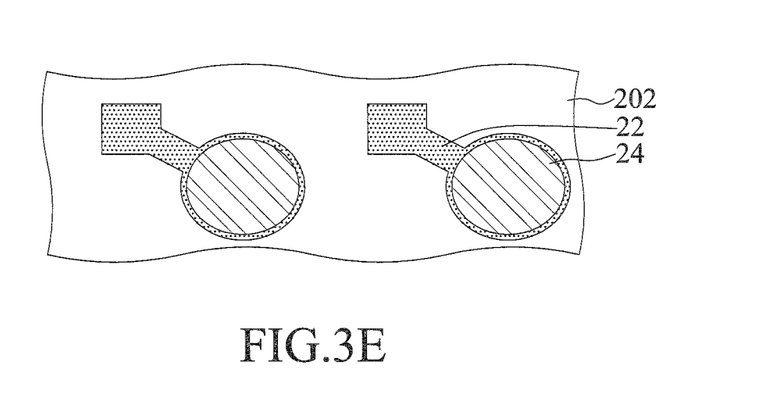

As shown in FIGS. 2E and 3E, a conductive element 24 such as a soldering tin material is formed on each of the conductive pads 230 in the vias 220 and electrically connected to the wiring layer 23.

In an embodiment, the junction portion a also can be referred to as an area where the conductive elements 24 are disposed.

In an embodiment, under bump metallurgy (UBM) can be formed on the conductive pads 230, and the conductive element 24 is formed on the under bump metallurgy.

In an embodiment, following the process of FIG. 2C', the substrate structure 2' is obtained as shown in FIG. 2E'. FIG. 3E shows the top view of FIG. 2E'.

In a method of manufacturing a substrate structure according to the present invention, the first insulating layer 21 and the second insulating layer 22 are formed within a relatively small area, respectively. In other words, the first insulating layer 21 is only formed within the wiring area A, and the second insulating layer 22 is only formed along the formation area of the wiring layer 23 (i.e., the wiring area A). Therefore, the wiring area of the insulating layer is reduced, the contact area between the carrier 20 and the insulating layer is reduced accordingly, the CTE difference between the two is substantially reduced, the warpage degree of the substrate structure 2 is minimized, and the stress reliability of the of the conductive element 24 is thus enhanced.

The present invention further provides a substrate structure 2, 2', having: a carrier 20, a first insulating layer 21, 21', a wiring layer 23, and a second insulating layer 22.

In an embodiment, the carrier 20 has conductive pads 201 which are electrically connected to the wiring layer 23, and is defined with at least one wiring area A, A' that is positioned on a portion of the surface of the carrier 20 and includes a junction portion a.

The first insulating layer A, A' is only formed within the wiring area A, A of the carrier 20.

The wiring layer 23 is formed on the first insulating layer 21, 21' within the wiring area A, A'.

The second insulating layer 22 is only formed within the wiring area (i.e., formed along the formation region of the wiring layer 23), and covers the wiring layer 23 and the first layer 21, 21'.

In an embodiment, the carrier 20 has a dielectric layer 202, and the first insulating layer 21, the wiring layer, and the second insulating layer 22 are formed on the dielectric layer 202.

In an embodiment, the first insulating layer 21 is only formed within the junction portion a, and the wiring layer 23 is formed with a ladder-shaped portion at a position corresponding to a side of the first insulating layer 21. In an embodiment, the conductive pads 230 contact with the first insulating layer 21, and the other portion of the wiring layer 23 contacts with the carrier 20.

In an embodiment, the second insulating layer 22 has vias 220 that expose a portion of the wiring layer 23, and are positioned at the junction portion a. In an embodiment, the substrate structure 2, 2' further comprises the conductive element 24 that is electrically connected to the wiring layer 23 in the vias 220.

In sum, the substrate structure and method of manufacturing the same according to the present invention avoid substrate warpage and increase the stress reliability of the conductive element by reducing the wiring area of the first and the second insulating layers and reducing the contact area and the CTE difference between the carrier and the insulating layer.

The present invention has been described using exemplary embodiments to illustrate the principles and the effects of the present invention, but not intend to limit the present invention. The present invention without departing from the spirit and scope of the premise can make various changes and modifications by a person skilled in the art. Therefore, the scope of protection of the rights of the invention, the claim should be listed in the book. Therefore, the scope of the invention should be defined by the appended claims.

What is claimed is:

1. A substrate structure, comprising;
   a carrier having a dielectric layer and at least a wiring area defined and positioned on a portion of a surface of the carrier;
   a first insulating layer formed on the at least a wiring area;
   a wiring layer formed on and in contact with the first insulating layer and the dielectric layer; and
   a second insulating layer formed on the first insulating layer, the wiring layer, and the wiring area of the carrier and exposing a portion of a surface of the dielectric layer.

2. The substrate structure according to claim 1, wherein the carrier further comprises a plurality of conductive pads electrically connected to the at least a wiring layer.

3. The substrate structure according to claim 1, wherein the first insulating layer, the at least a wiring layer and the second insulating layer are formed on the dielectric layer.

4. The substrate structure according to claim 1, wherein the first insulating layer is merely formed on a junction portion of each of the at least a wiring area.

5. The substrate structure according to claim 1, wherein the at least a wiring layer is formed with a ladder-shaped portion at a position corresponding to a side of the first insulating layer.

6. The substrate structure according to claim 1, wherein the second insulating layer is formed on the wiring area only.

7. The substrate structure according to claim 4, wherein the second insulating layer has a plurality of vias that expose a portion of the wiring layer and are positioned at the junction portion.

8. The substrate structure according to claim 7, further comprising a plurality of conductive elements disposed in the vias and electrically connected to the wiring layer.

9. The substrate structure according to claim 1, wherein the second insulating layer covers the wiring layer.

10. A method of manufacturing a substrate structure, comprising:
    forming a first insulating layer on at least a wiring area of a carrier having a dielectric layer, wherein the wiring area is positioned on a portion of a surface of the carrier;
    forming a wiring layer on and in contact with the first insulating layer formed on the wiring area and the dielectric layer; and
    forming a second insulating layer on the first insulating layer, the wiring layer, and the wiring area of the carrier, wherein a portion of a surface of the dielectric layer is exposed from the second insulating layer.

11. The method according claim 10, wherein the carrier comprises a plurality of conductive pads electrically connected to the wiring layer.

12. The method according claim 10, wherein the first insulating layer, the wiring layer and the second insulating layer are formed on the dielectric layer.

13. The method according claim 10, wherein the first insulating layer is formed on a junction portion of the wiring area.

14. The method according claim 10, wherein the wiring layer is formed with a ladder-shaped portion at a position corresponding to a side of the first insulating layer.

15. The method according claim 10, wherein the second insulating layer is formed on the wiring area.

16. The method according claim 13, wherein the second insulating layer has a plurality of vias that expose a portion of the wiring layer and positioned at the junction portion.

17. The method according claim 10, further comprising forming a plurality of conductive elements in the vias, and electrically connecting the conductive element to the wiring layer.

18. The method according claim 10, wherein the second insulating layer covers the wiring layer.

\* \* \* \* \*